United States Patent [19]

Uno et al.

[11] Patent Number: 4,593,309
[45] Date of Patent: Jun. 3, 1986

[54] METHOD OF CONVERGENCE MEASUREMENT FOR A COLOR PICTURE TUBE AND AN APPARATUS THEREFOR

[75] Inventors: Shinichi Uno; Etsuji Suzuki; Ryuhachirou Douji; Mituji Inoue, all of Yokohama, Japan

[73] Assignee: Tokyo Shibaura Denki Kabushiki Kaisha, Kawasaki, Japan

[21] Appl. No.: 543,457

[22] Filed: Oct. 19, 1983

[30] Foreign Application Priority Data

Oct. 21, 1982 [JP] Japan .............................. 57-185112

[51] Int. Cl.⁴ .......................................... H04N 17/02
[52] U.S. Cl. ..................................... 358/10; 315/368
[58] Field of Search ......................... 358/10; 315/368

[56] References Cited

U.S. PATENT DOCUMENTS

| 4,254,432 | 3/1981 | Nakahata | 358/10 |
| 4,316,211 | 2/1982 | Mackey et al. | 358/10 |
| 4,364,079 | 12/1982 | Pons | 358/10 |
| 4,387,394 | 6/1983 | Powell | 358/10 |
| 4,441,120 | 4/1984 | Gerritsen | 358/10 |

FOREIGN PATENT DOCUMENTS

| 138978 | 10/1980 | Japan . | |
| 21151 | 5/1982 | Japan . | |
| 131186 | 8/1982 | Japan | 315/368 |

Primary Examiner—John W. Shepperd
Attorney, Agent, or Firm—Cushman, Darby and Cushman

[57] ABSTRACT

The convergence of a color picture tube is measured by first indicating a prescribed pattern in a reference position on the picture tube. The image of a pattern for each light beam color in the picture tube is picked-up, and then this display position of the pattern is shifted. An image of the pattern in the shifted position is then picked-up for each beam color in the tube which gives a second image pick-up data. The average values of the data obtained from the non-shifted and shifted pattern for each light beam color is used to determine the convergence of the color picture tube.

8 Claims, 18 Drawing Figures

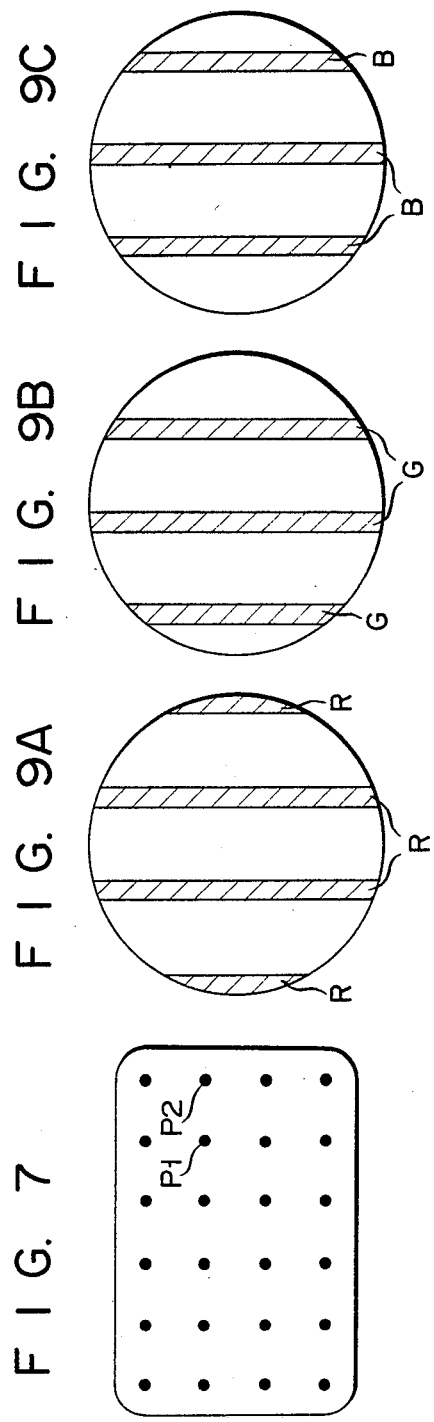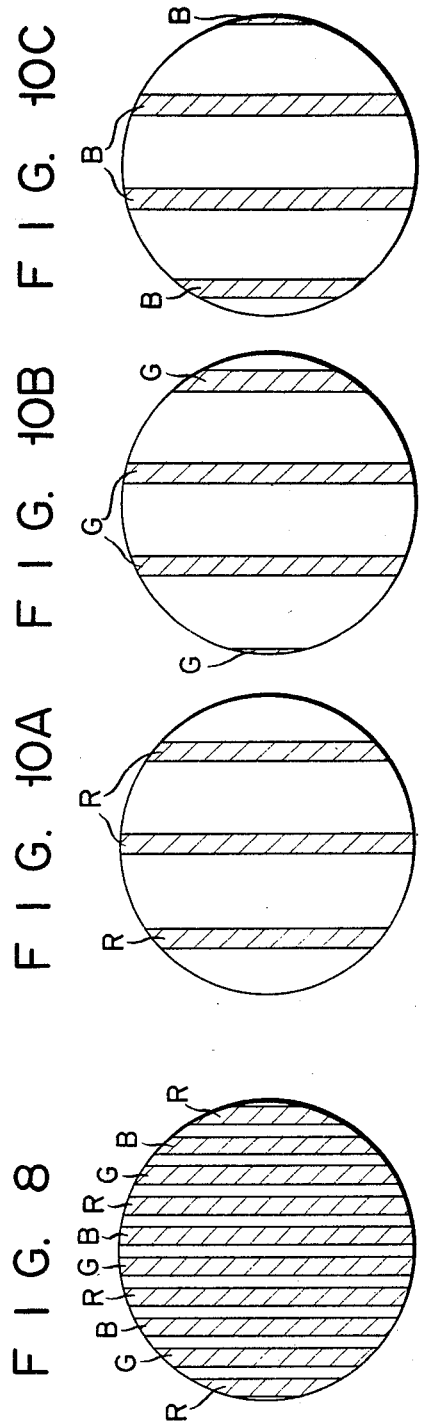

METHOD OF CONVERGENCE MEASUREMENT FOR A COLOR PICTURE TUBE AND AN APPARATUS THEREFOR

BACKGROUND OF THE INVENTION

The present invention relates to a method of convergence measurement and an apparatus therefor, for use in measuring the convergence of electron beams in a color picture tube, i.e., for use in measuring the convergence of the three electron beams applied to red, green and blue phosphor layers which emit red, green and blue light beams, respectively.

In testing a color picture tube, it is essential to measure and correct the convergence of the tube.

In a prior art convergence measurement system, a dot pattern or other prescribed test pattern is indicated on the display screen of a picture tube to be tested, and an image of the pattern is picked up for each of the red, green and blue light beams, by means of, e.g., an industrial television (ITV) camera. The light emitting centers of the phosphor layers of the individual colors in the pattern are determined on the basis of image data for the individual colors, the amounts of displacement of the light emitting centers from a reference point are calculated, and the convergence is obtained on the basis of the amounts of displacement.

In one typical type of tricolor picture tube, phosphor stripes or layers of a predetermined width emitting red, green and blue light beams are successively and alternately arranged at regular intervals and pitches, over the entire surface of the display screen. A color image or picture is indicated on the display screen by applying electron beams to the phosphor layers, with the aid of a shadow mask or aperture grill. If a matrix-shaped dot pattern is displayed as a test pattern, the arrangements of phosphor layers K for an optional light beam color, in dots P of the dot pattern, vary with the display positions of the dots P on the display screen, as shown in FIGS. 1A to 1D. Thus, although the dots P have the same surface area, the amounts of displacement of the light emitting centers of the phosphor layers K in the individual dots P, from the centers of the dots P, vary with the display positions.

FIG. 2 shows the amounts of displacement of the centers O' of the phosphor layers K arranged in dots $P_I$, $P_{II}$, $P_{III}$, $P_{IV}$ and $P_V$ of a dot pattern, from the centers O of the phosphor layers K, as compared to the display positions of the individual dots on the display screen.

Thus, according to the prior art method described above, it is impossible to correct errors attributed to displacement which varies with the display position, so that accurate convergence cannot be obtained.

SUMMARY OF THE INVENTION

Since the present invention has been contrived in view of the above, it is intended to provide a method of convergence measurement for a color picture tube, and an apparatus therefor, which is capable of highly accurate convergence measurement.

According to the invention, a method for measuring the convergence of a color picture tube is provided, which comprises the steps of indicating a prescribed pattern in a reference position on the display screen of a picture tube on which a plurality of light emitting layers emitting light beam of different colors are successively and alternately arranged at regular intervals, picking up the image of a pattern for each light beam color from a predetermined position, thereby providing first image pickup data, shifting the display position of the pattern on the display screen from the reference position to a shifted position at a distance half the arrangement pitch of the light emitting layers, in the arrangement direction thereof from the reference position, picking up an image of the pattern in the shifted position, for each light beam color from the predetermined position, thereby providing second image pickup data, and calculting the average values of the first and second image pickup data for each light beam color and determining the convergence on the basis of the average values. A convergence measuring apparatus for a color picture tube is further provided, which comprises means for selectively generating a prescribed pattern in a reference position on the display screen of a picture tube on which a plurality of light emitting layers emitting light beams of different colors are successively and alternately arranged at regular intervals, and in a shifted position at a distance half the arrangement pitch of the light emitting layers, in the arrangement direction thereof from the reference position, image pickup means opposed to the display screen of the picture tube and movable along the display screen, whereby images of the pattern are picked up for each light beam color, and arithmetic control means for calculating the average values of each light beam color of image pickup data for the patterns in the reference position and the shifted position provided by the image pickup means, and determining the convergence of the picture tube on the basis of the average values.

BRIEF DESCRIPTION OF THE DRAWINGS

FIG. 7 shows a matrix-shaped dot pattern indicated on the display screen of the color picture tube;

FIG. 8 is an enlarged view of a dot in the dot pattern shown in FIG. 7;

FIGS. 9A, 9B and 9C show image patterns obtained by a convergence measuring method according to the invention;

FIGS. 10A, 10B and 10C show image patterns obtained by the convergence measuring method of the invention.

DETAILED DESCRIPTION OF THE PREFERRED EMBODIMENTS

Figure 1A:
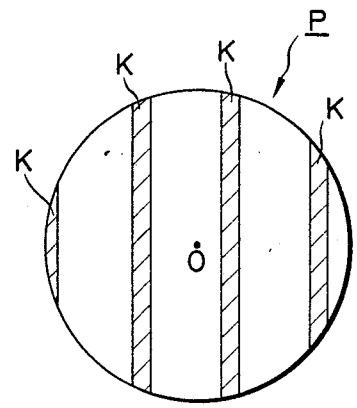
FIGS. 1A, 1B, 1C and 1D show dot patterns in different positions on the display screen of a color picture tube.
Figure 1B:
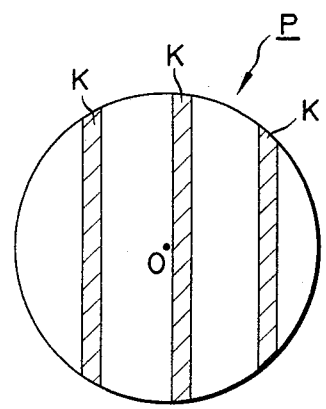
Figure 1C:
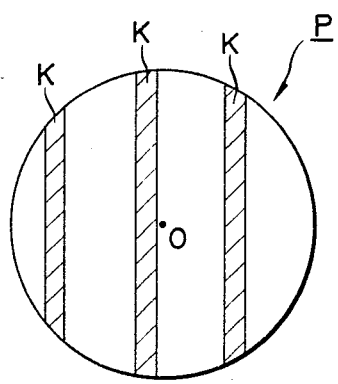
Figure 1D:
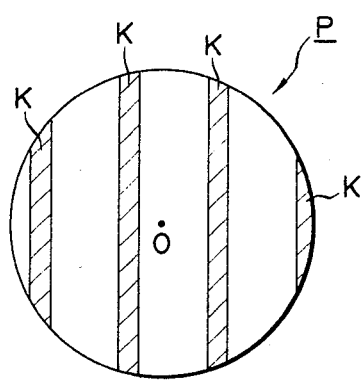
Figure 2:
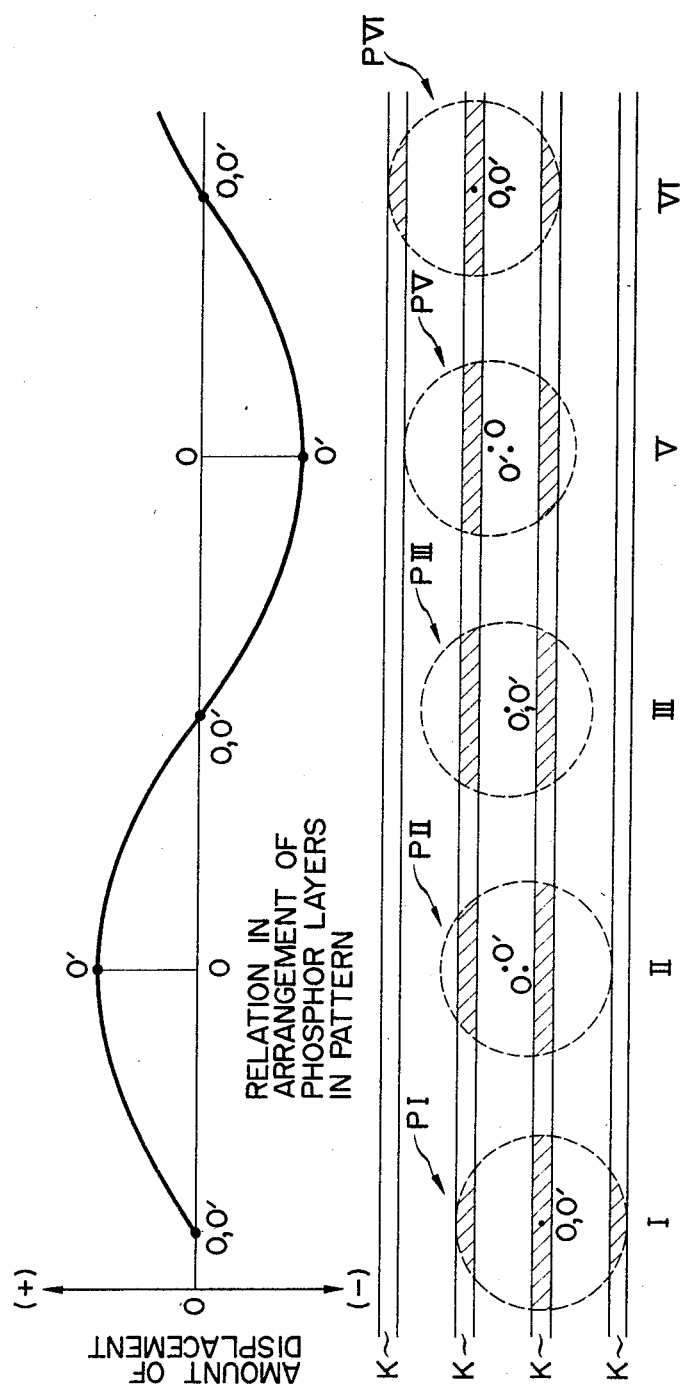
FIG. 2 is a diagram showing patterns for individual display positions, and the amounts of displacement of the light emitting centers O' of phosphor layers in the patterns, from the centers O of the patterns.
Figure 3:
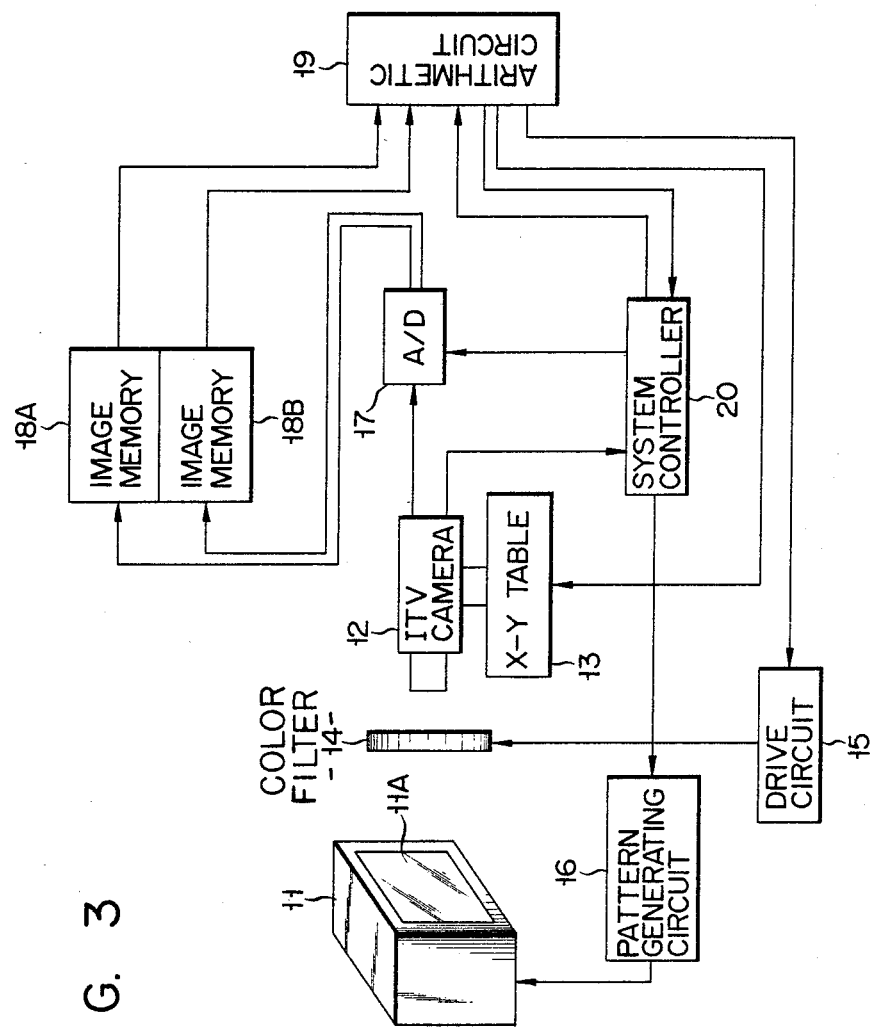
FIG. 3 shows a convergence measuring apparatus according to one embodiment of the present invention.
Figure 4:
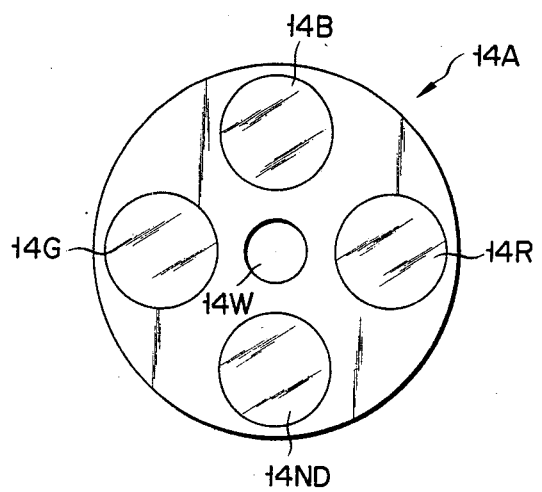
FIG. 4 shows a filter in the measuring apparatus shown in FIG. 3.
Figure 5:
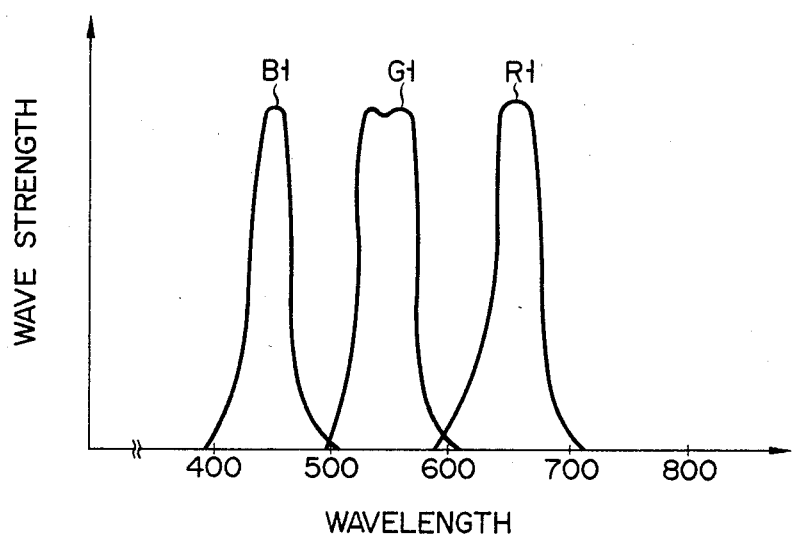
FIG. 5 shows light spectra of the filter shown in FIG. 4.

With reference to FIG. 3, which shows a measuring apparatus according to one embodiment of the present invention, a color picture tube 11 serving as test object has an image display screen 11A. Red, green and blue phosphor layers (not shown) are successively and alternately arranged at regular intervals and pitches on the display screen 11A. The red, green and blue layers emit red, green and blue light beams, respectively, when they receive electron beams on their inner surfaces. The color picture tube 11 is fixed to a testing stand (not shown). An industrial television (ITV) camera 12 is opposed to the display screen 11A of the picture tube 11. The ITV camera 12 is placed on an X-Y table 13 movable in the X and Y-directions, so that it can move in the extending direction of the display screen 11A, i.e., along the display screen 11A. A color filter 14 is disposed in an optical path between the display screen 11A and the ITV camera 12. As shown in FIG. 4, for example, the color filter 14 is formed of an untransmissible disk 14A which comprises a red-pass filter element 14R transmitting a red color light beam, a green-pass filter element 14G transmitting a green color light beam, a blue-pass filter element 14B transmitting a blue color light beam, and a dimming filter element 14ND for attenuating the incident light intensity. These filter elements are arranged individually in openings which are formed on the quadrants of the circle defined by the filter 14. The drive shaft of a drive unit 15 (to be mentioned later) is fitted into an opening 14W which is formed in the center of the filter disk 14A. Filter elements 14R, 14G and 14B have the light spectra represented by characteristic curves R1, G1 and B1, respectively, as shown in FIG. 5. The filter 14 is rotated by the drive unit 15 including, e.g., a step motor serving as a drive element, whereby a desired one of the filter elements is set in the optical path.

A signal from a pattern generating circuit 16 is applied to the picture tube 11. Based on the control signal from the pattern generating circuit 16, a predetermined pattern is indicated on the display screen 11A of the picture tube 11, lying selectively in a reference position or a shifted position at a distance half the arrangement pitch of the phosphor layers along the arrangement direction thereof from the reference position. Hereinafter, the patterns indicated in the refernece position and the shifted position will be referred to as a reference position pattern and a shifted position pattern, respectively, for ease of explanation.

Figure 6:
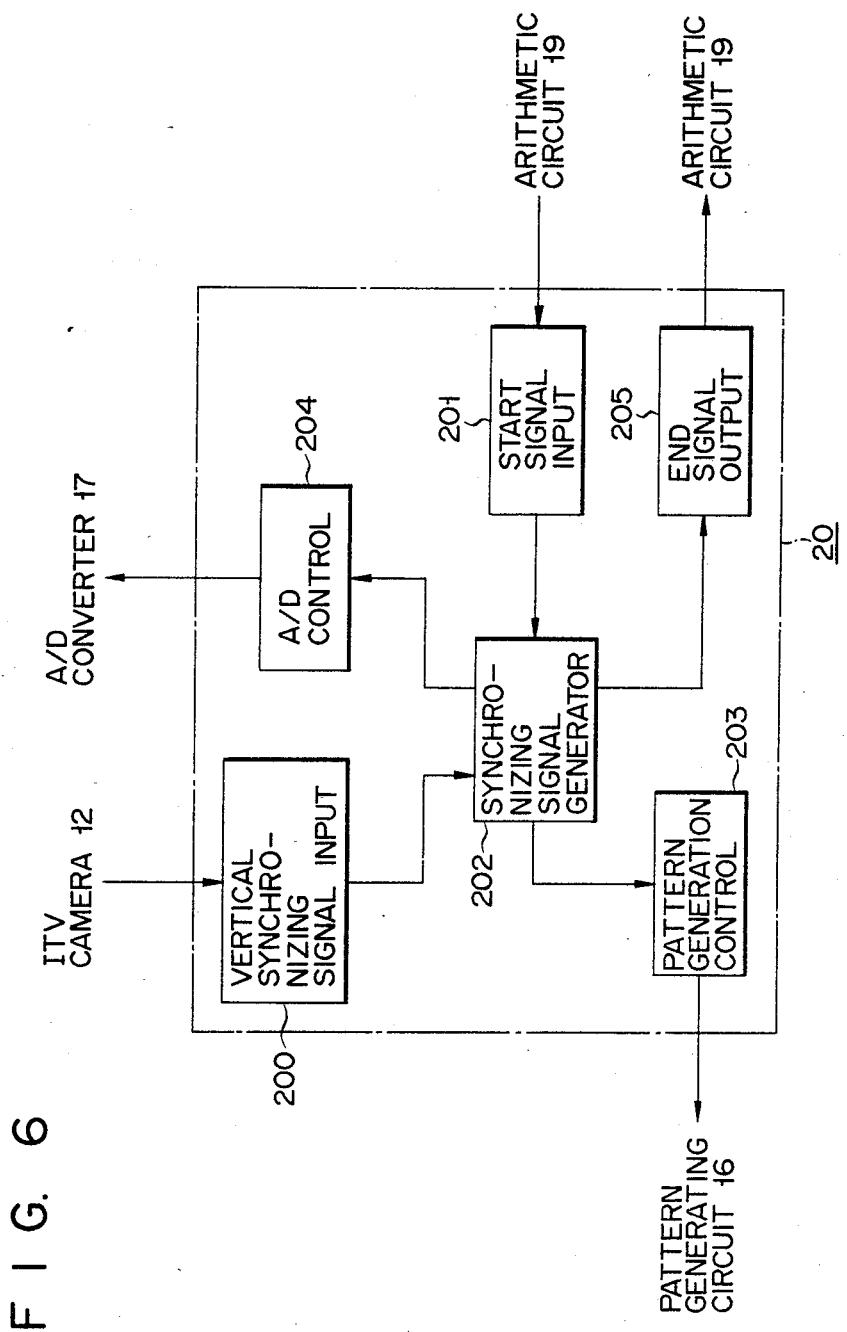
FIG. 6 is a detailed block diagram showing the configuration of a system controller of the measuring apparatus shown in FIG. 3.

The ITV camera 12 picks up the pattern image on the display screen 11A for each transmitted light beam defined by the filter element positioned in the optical path, i.e., for each emitted light beam color. An image pickup signal from the ITV camera 12 is applied to an A/D converter 17, where it is converted into a digital signal. The converted image pickup signal is applied selectively to one of image memories 18A and 18B to be stored therein. The image memory 18A stores an image pickup signal for the reference position pattern, while the image memory 18B stores an image pickup signal for the shifted position pattern. The image pickup signal stored in the image memory 18A or 18B is applied to an arithmetic control circuit 19. The arithmetic control circuit 19 includes, e.g., a microprocessor which serves as a central processing unit, and performs various arithmetic operations and control related to convergence measurement. The pattern generating circuit 16, the A/D converter 17 and the arithmetic control circuit 19 operate under the control of a system controller 20. As shown in FIG. 6, the system controller 20 comprises a vertical synchronizing signal input circuit 200 receiving a vertical synchronizing signal from the ITV camera 12; a measurement start signal circuit 201 receiving a measurement start signal from the arithmetic control circuit 19; a synchronizing signal generating circuit 202 for generating various synchronizing signals in synchronism with the vertical synchronizing signal from the ITV camera 12; a pattern generation control circuit 203 for delivering a pattern generation control signal to the pattern generating circuit 16, in synchronism with a synchronizing signal for pattern generation from the synchronizing signal generator circuit 202, an A/D conversion control circuit 204 for delivering a conversion instruction signal to the A/D converter 17, in synchronism with a synchronizing signal for A/D converter control from the synchronizing signal generator circuit 202; and an image pickup end signal output circuit 205 for generating an image pickup end signal, in synchronism with a signal generated from the synchronizing signal generator circuit 202 at the end of image pickup operation.

The manipulation and operation of the color picture tube convergence measurement system using the convergence measuring apparatus of the aforementioned construction may be described as follows.

First, the color picture tube 11 is set in position on the testing stand (not shown). Then, the arithmetic control circuit 19 is actuated to generate a drive signal for driving the X-Y table 13. Thus, the ITV camera 12 on the X-Y table 13 is moved along the display screen 11A of the color picture tube 11 so that an image pickup region of the display screen 11A is set to the reference position of the pattern to be indicated later on the display screen 11A in response to a signal from the pattern generating circuit 16. The arithmetic control circuit 19 also delivers a drive signal to the filter drive circuit 15. In response to the drive signal, the filter drive circuit 15 rotates the filter 14, thereby setting a desired filter element, e.g., the green-pass filter element 14G, in the optical path between the display screen 11A and the ITV camera 12. Here, let it be supposed that the green-pass filter element 14G is set in position.

In this state, a measurement start signal is delivered from the arithmetic control circuit 19 to the start signal input circuit 201 of the system controller 20. Receiving the start signal, the input circuit 201 delivers a signal to the synchronizing signal generator circuit 202. In response to the output signal from the input circuit 201, the synchronizing signal generator circuit 202 delivers a pattern generation control signal to the pattern generation control circuit 203. In response to the control signal from the synchronizing signal generator circuit 202, the pattern generation control circuit 203 delivers a signal to the pattern generator circuit 16. Receiving the signal from the pattern generation control circuit 203, the pattern generator circuit 16 is actuated to deliver signal to the color picture tube 11, so that a test pattern, such as the matrix-shaped dot pattern shown in FIG. 7, is indicated in the reference position on the display screen 11A . FIG. 8 is an enlarged view of one dot P1 in the pattern shown in FIG. 7. As shown in FIG. 8, the red, green and blue phosphor layers R, G, B are successively and alternately arranged at regular intervals and pitches in the dot P1. When the reference position pattern is indicated on the display screen 11A , the ITV camera 12 starts an image pickup operation for, e.g., dot P1. Since the green-pass filter element 14G is set in the optical path between the display screen 11A and the ITV camera 12, only the green phosphor layer G of the pattern is picked up by the ITV camera 12, producing the image shown in FIG. 9B. The image pickup signal produced by the ITV camera 12 is applied to the A/D converter 17. The image pickup signal applied to the A/D converter 17 is converted into a digital signal under the control of a conversion signal which is supplied from the A/D conversion control circuit 204. The converted image pickup signal is stored in the image memory 18A. Namely, the image pickup signal for the green phosphor layer G is stored in the image memory 18A.

When the storage of the image pickup signal for the green phosphor layer G in the image memory 18A is ended, an instruction signal for the shift of the pattern display position on the display screen 11A is delivered from the pattern generation control circuit 203 of the system controller 20 to the pattern generator circuit 16. Receiving the shift instruction signal from the pattern generation control circuit 203, the pattern generator circuit 16 generates an instruction signal for shifting the pattern display position on the display screen 11A to a position at a distance half the arrangement pitch of the phosphor layers, in the arrangement direction thereof from the reference position. As a result, the dot pattern shown in FIG. 7 is indicated in the shifted position on the display screen 11A. The shifted position pattern is picked up by the ITV camera 12 fixed in the position for the pickup of the reference position pattern, in the same manner as for the reference position pattern. Specifically, an image of the dot P1 in the shifted position pattern is picked up in like manner. In this case, the green-pass filter element 14G is set in the optical path between the display screen 11A and the ITV camera 12, so that only the green phosphor layers G of the pattern are picked up, as shown in FIG. 10B. As in the case of the image pickup operation for the reference position pattern, the image pickup signal produced by the ITV camera 12 is applied to the A/D converter 17, where it is converted to a digital signal. The converted image signal is applied to the image memory 18B to be stored therein. When the storage of the image signal in the image memory 18B is ended, an image pickup end signal is generated from the end signal output circuit 205 of the system controller 20, and is applied to the arithmetic control circuit 19. Receiving the end signal, the arithmetic control circuit 19 add the image data stored in the image memories 18A and 18B, and then divide the resultant sum by two, thereby obtaining the average value of each pair of different data. Thereafter, the arithmetic control circuit 19 calculates data on the light emitting centers of the green phosphor layers of the patterns of the averaged images, from the individual average values obtained, and temporarily stores the calculated values.

After the aforesaid arithmetic processing is completed, the arithmetic control circuit 19 delivers a drive signal to the filter drive circuit 15, to actuate the same. As a result, the filter 14 is rotated in such a way as to change the filter element set in the optical path between the display screen 11A and the ITV camera 12 from filter element 14G to filter element 14R. The arithmetic control circuit 19 also delivers a measurement start signal to the start signal input circuit 201 of the system controller 20. In response to this, the pattern generator circuit 16 delivers an instruction signal to the color picture tube 11, thereby causing the pattern to be indicated in the reference position on the display screen 11A. In the same manner as in the case of the green color, image data on the reference position pattern is produced by the ITV camera 12. In this case, the red-pass filter element 14R is set in the optical path between the display screen 11A and the ITV camera 12, so that only the red phosphor layers R of the pattern are picked up, as shown in FIG. 9A. The image data is stored in the image memory 18A. Thereafter, in the same manner as in the case of the green color, image data (FIG. 10A) on the shifted position pattern is produced and stored in the image memory 18B. The image data stored in the image memories 18A and 18B are inputted in the arithmetic control circuit 19. Then, the arithmetic control circuit 19 operates the image data to determine the light emitting center of the red phosphor layers of the pattern, and temporarily stores data on the center.

The operation for the color blue is performed in the same manner as in the cases of the color green and the color red. Specifically, the blue-pass filter element 14B is set in position, and images are picked up by the ITV camera to produce image data (FIG. 9C) on the reference position pattern and image data (FIG. 10C) on the shifted position pattern. This image data is applied to determine the light emitting center of the pattern.

When the centers of the green, red and blue phosphor layers are obtained in this manner, the arithmetic control circuit 19 calculates convergence based on the amounts of displacement of these centers from the reference position. These amounts of displacement, or the convergence calculated, are those of the centers of the red and blue phosphor layers, based on the center of the green phosphor layers. First, the amount of displacement RX for the color red is given by the equation:

$$\Delta RX = \frac{\left\{R \times 1 + \left(R \times 2 - \frac{T}{2}\right)\right\}}{2} - \frac{\left\{G \times 1 + \left(G \times 2 - \frac{T}{2}\right)\right\}}{2}$$

$$= \frac{(R \times 1 + R \times 2) - (G \times 1 + G \times 2)}{2}.$$

Here, RX1 and GX1 are coordinates based on the light emitting centers of the red and green phosphor layers, respectively, in the reference position pattern; RX2 and GX2 are coordinates based on the light emitting centers of the red and green phosphor layers, respectively, in the shifted position pattern; and T is the arrangement pitch of the phosphor layers.

Likewise, the amount of displacement BX for the blue color is given by the following equation:

$$\Delta BX = \frac{\left\{B \times 1 + \left(B \times 2 - \frac{T}{2}\right)\right\}}{2} - \frac{\left\{G \times 1 + \left(G \times 2 - \frac{T}{2}\right)\right\}}{2}$$

$$= \frac{(B \times 1 + B \times 2) - (G \times 1 + G \times 2)}{2}.$$

Here, BX1 and GX1 are coordinates based on the light emitting centers of the blue and green phosphor layers, respectively, in the reference position pattern; and BX2 and GX2 are coordinates based on the light emitting centers of the blue and green phosphor layers, respectively, in the shifted position pattern.

Once these arithmetic operations have been accomplished, the arithmetic control circuit 19 delivers a drive signal to the X-Y table 13, to move the ITV camera 12, thereby setting the image pickup position of the ITV camera 12 on the display screen 11A to the dot P2 in the pattern shown in FIG. 7. Then, the convergence is measured for the dot P2 in the same manner for the dot P1. Thereafter, the image pickup position is shifted in regular sequence to measure the convergence for the individual remaining dots, i.e., all of the dots. Thus, the measurement of the convergence of the color picture tube 11 is accomplished.

According to the method of convergence measurement of the embodiment described above, the convergence is calculated from the average of two pickup images; one being the image of a reference position pattern, and the other being the image of a shifted position pattern in a position at a predetermined distance from the reference position. Even though the arrangement of phosphor layers in the patterns vary with the display position, therefore, resulting measured values will never be affected thereby. Thus, the convergence obtained is subject to less error.

In the apparatus of the aforementioned embodiment, the pattern display position on the display screen 11A is moved in synchronism with the image pickup operation of the ITV camera 12. Thus, convergence measurement can be done in a stable manner.

Figure 11:
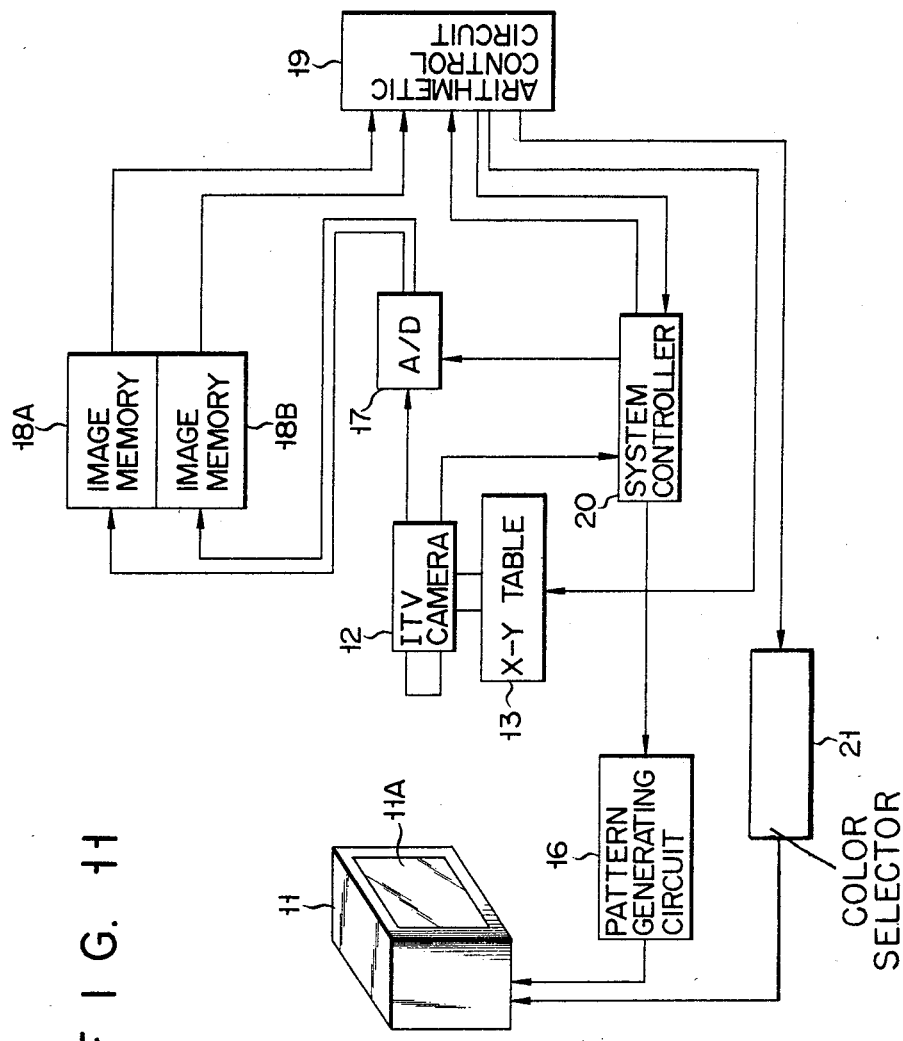
FIG. 11 shows a convergence measuring apparatus according to another embodiment of the invention.

The present invention is not limited to the embodiment described above. In the above embodiment, the light emitting centers of the phosphor layers are determined from images based on the average values of image data on the reference position pattern and the shifted position pattern. Alternatively, however, the light emitting centers of the phosphor layers may previously be determined for the individual pickup images so that the average values of data on the centers are calculated thereafter. Instead of using the filter 14 and the drive circuit 15, an electron beam controller 21 may be provided, as shown in FIG. 11, so that electron beams to be applied to the phosphor layers of the individual colors are generated in response to a control signal from the arithmetic control circuit 19 on a time division basis, whereby unicolored image data are successively obtained for the phosphor layers of each color. The ITV camera may be replaced with a camera using a solid image sensor. A crosshatched pattern or any other suitable test pattern may be used in place of the dot pattern. It is thus to be understood that various changes and modifications may be effected in the present invention by one skilled in the art, without departing from the scope or spirit of the invention.

What is claimed is:

1. A method for measuring the convergence of a color picture tube, comprising the steps of:
    indicating a prescribed pattern in a reference position on the display screen of a picture tube on which a plurality of light emitting layers emitting light beams of different colors are successively and alternately arranged at regular intervals;
    picking up the image of a pattern for each light beam color from a predetermined position, thereby providing first image pickup data,
    shifting the display position of the pattern on the display screen from the reference position to a shifted position at a distance half the arrangement pitch of the light emitting layers, in the arrangement direction thereof from the reference position;
    picking up an image of the pattern in the shifted position, for each light beam color from the predetermined position, thereby providing second image pickup data; and
    calculating the average values of the first and second image pickup data for each light beam color and determining the convergence on the basis of the average values.

2. The method according to claim 1, wherein said steps of providing the first and second image pickup data include steps of successively collecting the first and second image pickup data for each individual reference position of the pattern.

3. The method according to claim 1, wherein said steps of providing the first and second image pickup data include steps of successively collecting only the first image pickup data for each individual reference position in the pattern and, then, successively collecting the second image pickup data.

4. A convergence measuring apparatus for a color picture tube, comprising:
    means for selectively generating a prescribed pattern in a reference position on the display screen of a picture tube on which a plurality of light emitting layers emitting light beams of different colors are successively and alternately arranged at regular intervals, and in a shifted position at a distance half the arrangement pitch of the light emitting layers, in the arrangement direction thereof from the reference position;
    image pickup means opposed to the display screen of the picture tube and movable along the display screen, whereby images of the pattern are picked up for each light beam color; and
    arithmetic control means for calculating the average values of each light beam color of image pickup data for the patterns in the reference position and the shifted position provided by the image pickup means, and determining the convergence of the picture tube on the basis of the average values.

5. The measuring apparatus according to claim 4, further including control means adapted to operate in response to a control signal from the arithmetic control means, and deliver synchronizing signals to the pattern generating means and the image pickup means for operation control.

6. The measuring apparatus according to claim 4, wherein said image pickup means includes color image pickup means opposed to the display screen of the picture tube and movable along the display screen, and filter means disposed in an optical path between the display screen and the color image pickup means, whereby only a light beam of a selected color is transmitted.

7. The measuring apparatus according to claim 6, further including drive means for setting the filter means in the optical path, in accordance with a control signal from the arithmetic control means.

8. The measuring apparatus according to claim 4, wherein said image pickup means includes color image pickup means opposed to the display screen of the picture tube and movable along the display screen, and electron beam switching means for swithcing electron beams applied to the light emitting layers for the individual light beam colors.

* * * * *